(12) United States Patent  
Rooijers et al.

(10) Patent No.: US 11,973,476 B2  
(45) Date of Patent: Apr. 30, 2024

(54) CHOPPER AMPLIFIERS WITH LOW INTERMODULATION DISTORTION

(71) Applicant: Technische Universiteit Delft, Delft (NL)

(72) Inventors: Casper Thije Rooijers, Delft (NL); Johan H. Huijsing, Schipluiden (NL); Kofi A. A. Makinwa, Delft (NL)

(73) Assignee: Technische Universiteit Delft, Delft (NL)

( * ) Notice: Subject to any disclaimer, the term of this patent is extended or adjusted under 35 U.S.C. 154(b) by 63 days.

(21) Appl. No.: 17/304,965

(22) Filed: Jun. 29, 2021

(65) Prior Publication Data

US 2022/0077829 A1 Mar. 10, 2022

Related U.S. Application Data

(60) Provisional application No. 62/706,718, filed on Sep. 4, 2020.

(51) Int. Cl.  
*H03F 3/387* (2006.01)

(52) U.S. Cl.  
CPC ....... *H03F 3/387* (2013.01); *H03F 2200/271* (2013.01); *H03F 2200/375* (2013.01)

(58) Field of Classification Search  
CPC ... H03F 3/387; H03F 3/68; H03F 3/38; H03F 3/45475; H03F 3/72; H03F 1/3211; H03F 1/3223; H03F 1/26; H03F 2200/271; H03F 2200/375; H03F 2200/372; H03F 2200/396; H03F 2200/417; H03F 2200/421; H03F 2203/45051

(Continued)

(56) References Cited

U.S. PATENT DOCUMENTS 5,115,202 A   5/1992   Brown  
6,130,578 A   10/2000  Tang (Continued)

FOREIGN PATENT DOCUMENTS

CN   110417361 A   11/2019  
KR   960006631 B1  5/1996

OTHER PUBLICATIONS

Analog Devices, Inc. Data Sheet AD8551/AD8552/AD8554 "Zero-Drift, Single-Supply, Rail-to-Rail Input/Output Operational Amplifiers," Jun. 2015, in 24 pages.

(Continued)

*Primary Examiner* — Andrea Lindgren Baltzell  
*Assistant Examiner* — Khiem D Nguyen  
(74) *Attorney, Agent, or Firm* — Knobbe, Martens, Olson & Bear, LLP

(57) ABSTRACT

Chopper amplifiers with low intermodulation distortion (IMD) are provided. To compensate for IMD, at least one distortion compensation channel is included in parallel with chopper amplifier circuitry of a main signal channel. Additionally, output selection switches are included for selecting between the output of the main signal path and the distortional compensation channel(s) over time to maintain the output current continuous. Such IMD compensation can be realized by filling in missing current of the main signal channel using the distortion compensation channel(s), or by using channel outputs only when they have settled current.

18 Claims, 18 Drawing Sheets

(58) Field of Classification Search
USPC ... 330/9, 10, 69, 107, 124 R, 126, 252–261, 330/292, 295, 310
See application file for complete search history.

(56) References Cited

U.S. PATENT DOCUMENTS

| | | | |
|---|---|---|---|
| 6,734,723 | B2 | 5/2004 | Huijsing et al. |
| 7,132,883 | B2 | 11/2006 | Huijsing et al. |
| 7,336,123 | B2 | 2/2008 | Yoshida et al. |
| 7,764,118 | B2 | 7/2010 | Kusuda et al. |
| 7,834,685 | B1 | 11/2010 | Pertijs |
| 7,847,628 | B2 | 12/2010 | Denison |
| 7,973,596 | B2 | 7/2011 | Eschauzier et al. |
| 8,120,422 | B1 | 2/2012 | Huijsing et al. |
| 9,496,833 | B2 | 11/2016 | Kusuda |
| 9,634,617 | B2 | 4/2017 | Ivanov et al. |
| 9,729,109 | B2 | 8/2017 | Shu et al. |
| 2009/0309653 | A1* | 12/2009 | Luff .................. H03H 11/1295 330/9 |
| 2017/0047896 | A1 | 2/2017 | Shu et al. |
| 2020/0106409 | A1 | 4/2020 | Ivanov et al. |

OTHER PUBLICATIONS

Analog Devices, Inc. Data Sheet AD8571/AD8572/AD8574 "Zero-Drift, Single-Supply, Rail-to-Rail Input/Output Operational Amplifiers," Jun. 2015, in 28 pages.

Ivanov et al., "A 10MHz-Bandwidth 4µs-Large-Signal-Settling 6.5nV/VHz-Noise 2µV-Offset Chopper Operational Amplifier" IEEE International Solid-State Circuits Conference dated Feb. 1, 2016, in 3 pages.

Kusuda, "A 60 V Auto-Zero and Chopper Operational Amplifier With 800 kHz Interleaved Clocks and Input Bias Current Trimming," in IEEE Journal of Solid-State Circuits, vol. 50, No. 12, Dec. 2015, in 10 pages.

Linear Technology, LTC1051/LTC1053 Datasheet "Dual/Quad Precision Zero-Drift Operational Amplifiers With Internal Capacitors," Aug. 2007, in 16 pages.

Maxim Integrated MAX4238/MAX4239 Data Sheet Ultra-Low Offset/Drift, Low-Noise, Precision SOT23 Amplifiers dated Feb. 2018, in 11 pages.

ON Semiconductor Application Note, AND9857/D Zero-Drift Precision Op Amps: Advantages and Limitations of the Chopper-Stabilized Architecture dated Jun. 2019, in 12 pages.

Pertijs et al., "A 140 dB-CMRR Current-Feedback Instrumentation Amplifier Employing Ping-Pong Auto-Zeroing and Chopping," IEEE JSSC, vol. 45, No. 10, dated Oct. 2010, in 13 pages.

Renesas Application Note, the ICL7650S: a New Era in Glitch-Free Chopper Stabilized Amplifiers (AN053) dated Jul. 2001, in 15 pages.

Rooijers, et al., "An Auto-Zero Stabilized Voltage Buffer with a Trimmed Input Current of 0.2pA," ESSCIRC 2019—IEEE 45th European Solid State Circuits Conference (ESSCIRC), Cracow, Poland, 2019, in 4 pages.

Tang, "Bandpass spread spectrum clocking for reduced clock spurs in autozeroed amplifiers," in Proc. IEEE Int. Symp. Circuits Syst. (ISCAS), vol. 1, May 2001, pp. 663-666.

International Search Report and Written Opinion for International Application No. PCT/EP2021/072973 dated Nov. 18, 2021 in 19 pages.

\* cited by examiner

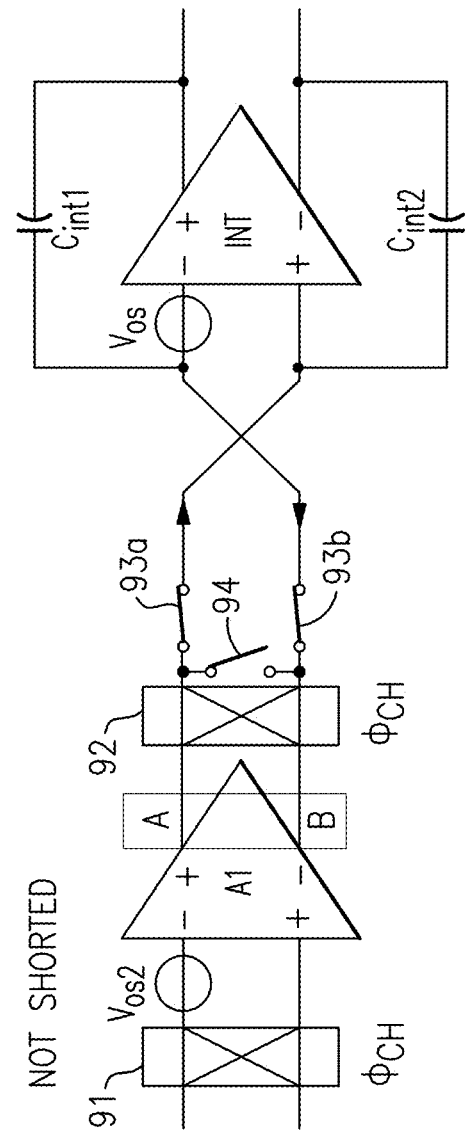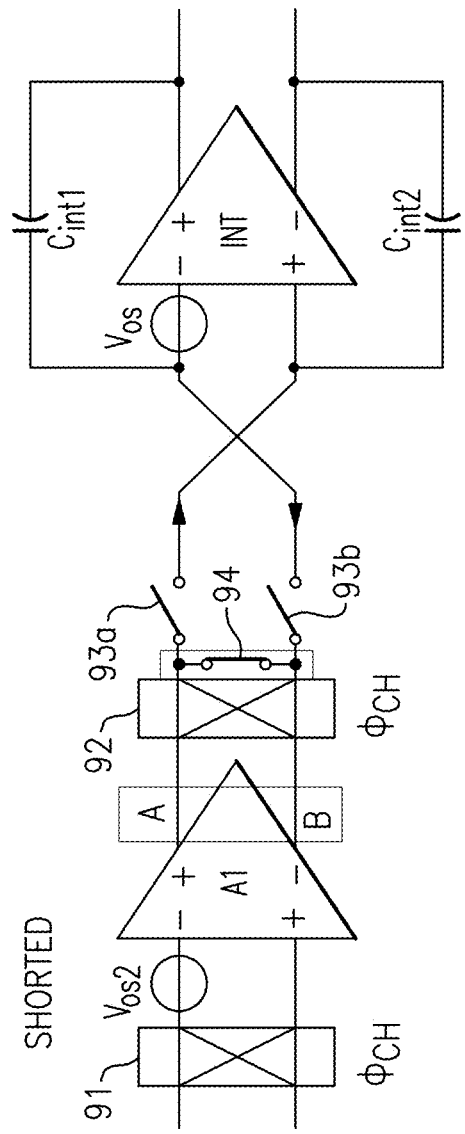

CHOPPER AMPLIFIERS WITH LOW INTERMODULATION DISTORTION

CROSS-REFERENCE TO RELATED APPLICATIONS

The present application claims priority to U.S. Provisional Patent Application No. 62/706,718, filed Sep. 4, 2020, and titled "CHOPPER AMPLIFIERS WITH LOW INTERMODULATION DISTORTION," the entirety of which is hereby incorporated herein by reference.

FIELD OF THE DISCLOSURE

Embodiments of the invention relate to electronic systems, and more particularly, to amplifiers.

BACKGROUND

An amplifier, such as an operational or instrumentation amplifier, can include chopper circuitry to help compensate for the amplifier's input offset voltage. For example, a chopper amplifier can include an input chopping circuit that can be used to chop the amplifier's input signal during an input chopping operation, thereby up-shifting the frequency of the amplifier's input signal. The chopper amplifier can further include an amplification circuit for amplifying the chopped input signal, and an output chopping circuit for down-shifting the frequency of the amplified signal during an output chopping operation. By providing chopping in this manner, the amplifier's input offset voltage is separated in frequency from the chopped input signal, and thus can be filtered or otherwise attenuated.

SUMMARY OF THE DISCLOSURE

Chopper amplifiers with low intermodulation distortion (IMD) are provided. To compensate for IMD, at least one distortion compensation channel is included in parallel with chopper amplifier circuitry of a main signal channel. Additionally, output selection switches are included for selecting between the output of the main signal path and the distortional compensation channel(s) over time to maintain a continuous output current. Such IMD compensation can be realized by filling in the missing current of the main signal channel using the distortion compensation channel(s), or by using the channel outputs only when their currents have settled.

In one aspect, a chopper amplifier with compensation for intermodulation distortion includes a main signal channel and a distortion compensation channel. The main signal channel includes input chopping switches configured to chop an input signal to generate a chopped input signal, an amplifier configured to amplify the chopped input signal to generate an amplified signal, and output chopping switches configured to chop the amplified signal to generate a chopped output signal. The distortion compensation channel is configured to receive the input signal, and to provide compensation for intermodulation distortion arising from a delay of the amplifier.

In another aspect, a method of with low intermodulation distortion includes chopping an input signal to generate a chopped input signal using input chopping switches of a main signal channel, amplifying the chopped input signal to generate an amplified signal using an amplifier of the main signal channel, chopping the amplified signal to generate a chopped output signal using output chopping switches of the main signal channel, and providing compensation for intermodulation distortion arising from a delay of the amplifier using a distortion compensation channel that receives the input signal.

In another aspect, a chopper amplifier with compensation for intermodulation distortion includes a main signal channel and a distortion compensation channel. The main signal channel includes input chopping switches configured to chop an input signal to generate a chopped input signal, an amplifier configured to amplify the chopped input signal to generate an amplified signal, and output chopping switches configured to chop the amplified signal to generate a chopped output signal. The distortion compensation channel is configured to receive the input signal, and includes means for compensating for intermodulation distortion arising from a delay of the amplifier.

BRIEF DESCRIPTION OF THE DRAWINGS

FIG. 9A is a schematic diagram of one example of differential virtual ground swing of an integrator at the output of a chopper amplifier.

FIG. 9B is a schematic diagram of another example of differential virtual ground swing of an integrator at the output of a chopper amplifier.

DETAILED DESCRIPTION OF EMBODIMENTS

Figure 1A:
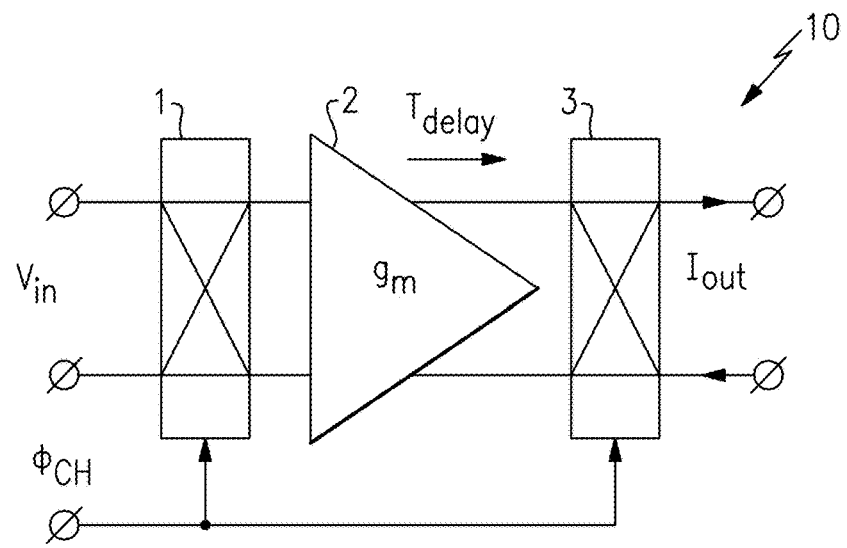
FIG. 1A is a schematic diagram of one example of chopper amplifier circuitry.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Absent compensation, an amplifier can have an input offset voltage and/or low frequency noise, such as flicker or 1/f noise having an associated noise power spectral density (PSD) that becomes larger at lower frequencies.

To reduce or remove input offset voltage and/or low frequency noise, an amplifier can include chopper circuitry. An amplifier with chopper circuitry is referred to as a chopper amplifier. In one example, a chopper amplifier includes an input chopping circuit that modulates the amplifier's input signal during an input chopping operation, thereby up-shifting the frequency of the amplifier's input signal. Furthermore, the chopper amplifier includes an amplification circuit that amplifies the chopped input signal, and an output chopping circuit that demodulates the amplified signal during an output chopping operation. By providing chopping in this manner, the amplifier's input offset voltage and/or low frequency noise is separated in frequency from the desired signal, and thus can be filtered or otherwise attenuated.

In certain implementations, a chopper amplifier can further include auto-zero circuitry. Including both auto-zero and chopper circuitry in a chopper amplifier can further lower overall input offset voltage and/or low frequency noise. The teachings herein are applicable not only to chopper amplifiers that provide chopping, but also to chopper amplifiers that combine chopping with auto-zeroing and/or other compensation schemes.

An amplifier's chopping operations can result in ripple appearing in the amplifier's output voltage. The chopping ripple can have a magnitude that changes in relation to the magnitude of the amplifier's input offset voltage and/or low frequency noise. Thus, chopping may result in the amplifier's input offset voltage and/or low frequency noise not being cancelled, but instead being modulated up by the chopping frequency to generate chopping ripple that corrupts the spectral integrity of the amplifier's output signal.

To provide compensation for chopping ripple, the chopper amplifier can include a variety of circuitry. In a first example, a low-pass post filter can be included after the output chopping circuit to filter chopping ripple associated with modulated input offset voltage and/or modulated low frequency noise. In another example, a switched capacitor notch filter can be included after the output chopping circuit to provide attenuation of chopping ripple. In yet another example, feedback and/or feedforward correction paths can also be used to suppress chopping ripple. The chopper amplifiers herein can use any such chopping ripple reduction scheme in combination with the low intermodulation distortion schemes herein.

FIG. 1A is a schematic diagram of one example of chopper amplifier circuitry 10 that can be included in a chopper amplifier.

The chopper amplifier circuitry 10 of FIG. 1A includes input chopping switches 1, an amplifier 2 (with transconductance $g_m$), and output chopping switches 3. In FIG. 1A, $T_{delay}$ represents the delay of amplifier 2. In this example, the input chopping switches 1 and the output chopping switches 3 are controlled by a common clock signal $\varphi_{CH}$. Additionally, the input chopping switches 1 receive a differential input voltage $V_{in}$, and the output chopping switches 3 output a differential output current $I_{OUT}$.

Figure 1B:
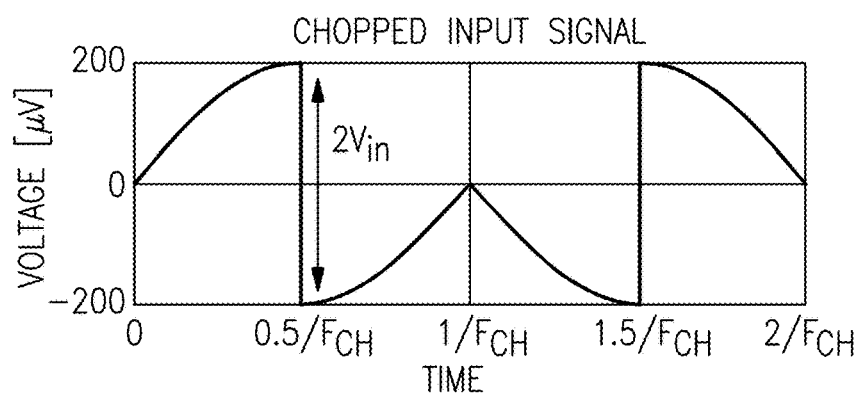
FIG. 1B is one example of a graph of chopped input signal voltage versus time for the chopper amplifier circuitry of FIG. 1A.
Figure 1C:
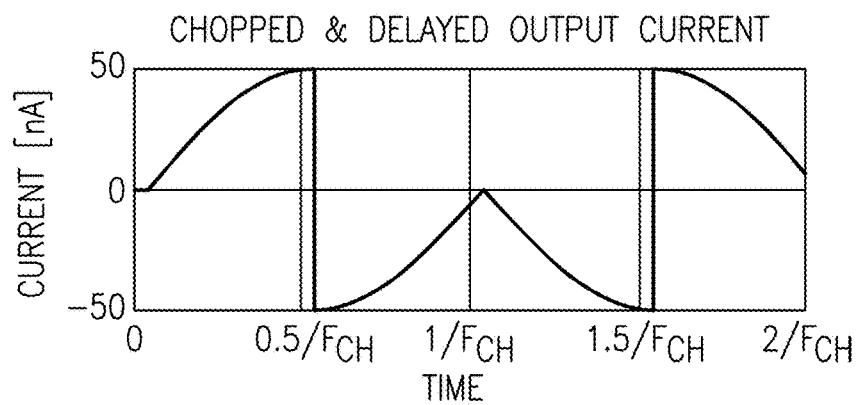
FIG. 1C is one example of a graph of chopped and delayed output current versus time for the chopper amplifier circuitry of FIG. 1A.
Figure 1D:
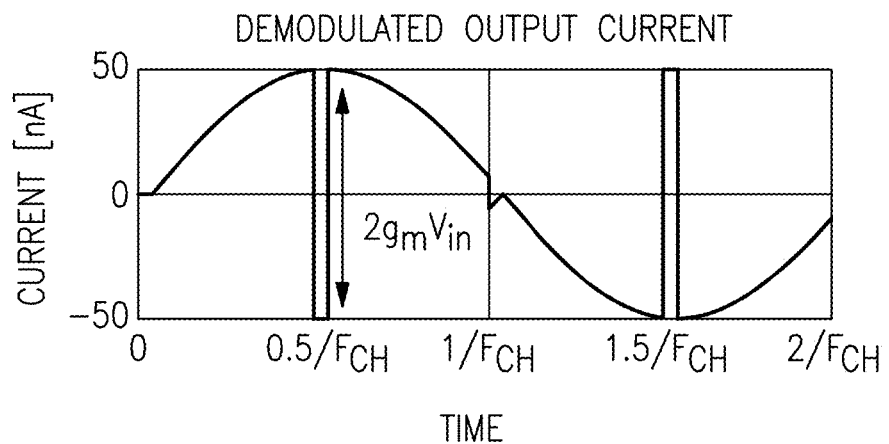
FIG. 1D is one example of demodulated output current versus time for the chopper amplifier circuitry of FIG. 1A.

FIG. 1B is one example of a graph of chopped input signal voltage versus time for the chopper amplifier circuitry 10 of FIG. 1A. FIG. 1C is one example of a graph of chopped and delayed output current versus time for the chopper amplifier circuitry 10 of FIG. 1A. FIG. 1D is one example of demodulated output current versus time for the chopper amplifier circuitry 10 of FIG. 1A. In the illustrated example, the time scale is based on the chopping frequency ($F_{CH}$) of the clock signal $\varphi_{CH}$.

The inventors of the present application have recognized that intermodulation distortion (IMD) arises in a chopper amplifier from a delay and/or limited bandwidth of the amplifier in the signal path between input chopping switches and output chopping switches. This delay and/or limited bandwidth leads to a discontinuous output current after the output chopping switches, which generates IMD tones.

Thus, chopping aids in achieving low offset and low-frequency noise. However, the interaction between the input signal and the chopper clock signal can cause chopper-induced IMD. This is especially problematic for input frequencies (Fin) near even multiples of the chopping frequency $\varphi_{CH}$, as the resulting IMD tones fold-back to low frequencies and thus cannot easily be filtered out.

Although spread-spectrum clocks can be used to convert such tones into noise-like signals, using spread-spectrum clocks also increases the noise floor and does not solve the underlying problem.

The inventors have recognized that chopper-induced IMD is mainly due to finite amplifier delay, which results in large chopping spikes.

Thus, chopping an amplifier (for instance, an operational transconductance amplifier or OTA) with finite delay ($T_{delay}$) causes large output spikes since the transitions of the output chopper are not aligned with the amplifier's delayed output signal. Accordingly, absent compensation, spikes in the demodulated output current ($I_{OUT}$) occur. Even though these spikes can be relatively short (for instance, a few nanoseconds), the amplitude of the spikes is proportional to the input signal, and thus can be a significant source of distortion.

Figure 1E:
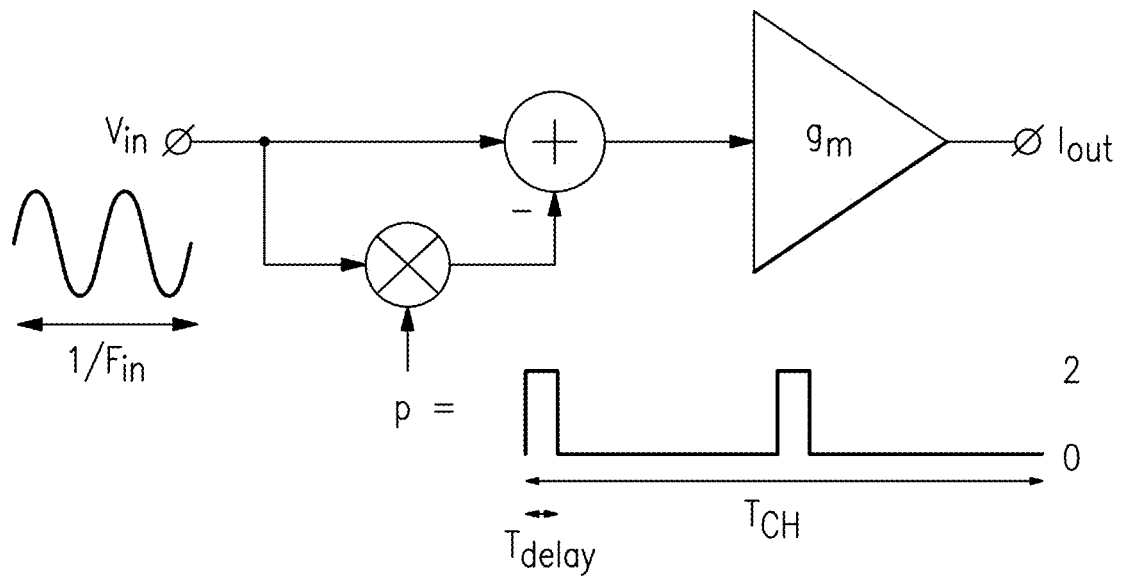
FIG. 1E is one example of a model of the chopper amplifier circuitry of FIG. 1A.

FIG. 1E is one example of a model of the chopper amplifier circuitry 10 of FIG. 1A.

In the frequency domain, the effect of these spikes can be understood by considering the model of an amplifier ($g_m$) as a pure delay ($T_{delay}$). Thus, as shown in FIG. 1E, a model of chopper amplifier circuitry can be obtained by multiplying the input signal ($V_{in}$) by a sequence of rectangular pulses (p) whose width is equal to the amplifier's delay and whose frequency is equal to twice the chopping period ($T_{CH}$). This multiplication causes input signals (with period $1/F_{IN}$) close to multiples of $2*T_{CH}$ to fold-back to near DC, thereby causing IMD tones.

The spikes can be reduced by increasing the amplifier's bandwidth (BW), but at the expense of a very significant increase in power (for instance, about 25× for 28 dB of IMD reduction, according to one set of simulations). The fixed delay model is a first-order model, and a more complicated model can be used, for instance, a model with finite amplifier BW causing a delay that is dependent on $F_{IN}$ and exponentially settling spikes instead of rectangular pulses.

The teachings herein are directed to chopper amplifiers with compensation for IMD.

Figure 1F:
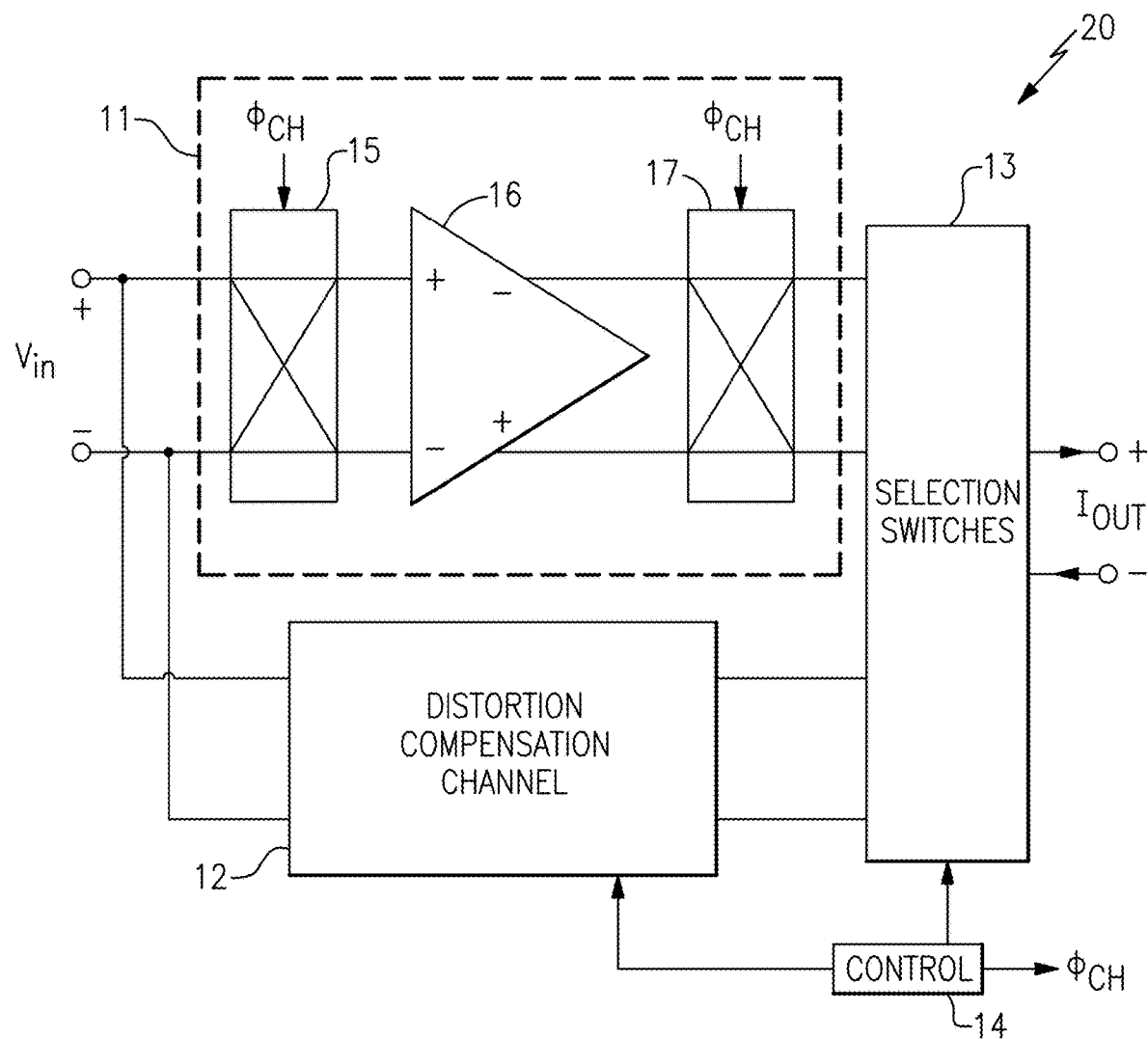
FIG. 1F is a schematic diagram of one embodiment of a chopper amplifier with intermodulation distortion (IMD) compensation.

FIG. 1F is a schematic diagram of one embodiment of a chopper amplifier 20 with IMD compensation. The chopper amplifier 20 includes a main signal channel 11, a distortion compensation channel 12, output selection switches 13, and a control circuit 14. The main signal channel 11 and the distortion compensation channel 12 each include a differential input configured to receive a differential input signal $V_{in}$, and a differential output connected to a corresponding differential input of the output selection switches 13. The output selection switches 13 provide a differential output current $I_{OUT}$ based on selecting the output of a desired channel over time.

In the illustrated embodiment, the main signal channel 11 includes input chopping switches 15 that are controlled by a chopping clock signal $\varphi C_H$, a differential amplifier 16, and output chopping switches 17 also controlled by the chopping clock signal $\varphi_{CH}$, in this example.

To compensate for IMD, at least one distortion compensation channel 12 is included in parallel with the chopper amplifier circuitry of the main signal channel 11. Additionally, the output selection switches 13 are included for selecting between the output of the main signal path 11 and the distortional compensation channel(s) 12 over time to maintain the output current continuous.

Although shown as separate from the main signal channel 11 and the distortion compensation channel 12, the output selection switches 13 can be integrated therein.

The output selection switches 13 operate to select from the channel outputs such that the output current $I_{OUT}$ is continuous, thereby achieving IMD compensation. Such IMD compensation can be realized by filling in missing current of the main signal channel 11 using the distortion compensation channel 12, or by using channel outputs only when they have settled current (for example, making sure the output current of the main signal channel 11 or the distortion compensation channel 12 has settled before being coupled to the differential output).

The control circuit 14 is used to generate any control signals for the chopper amplifier 20, including, but not limited to, clocks signals, operating phase control signals, and/or selection signals. The control circuit 14 can also be used to disable the distortion compensation channel 12 when unused, thereby conserving power. Any of the embodiments herein can include a control circuit for generating control signals for a chopper amplifier.

Figure 2A:
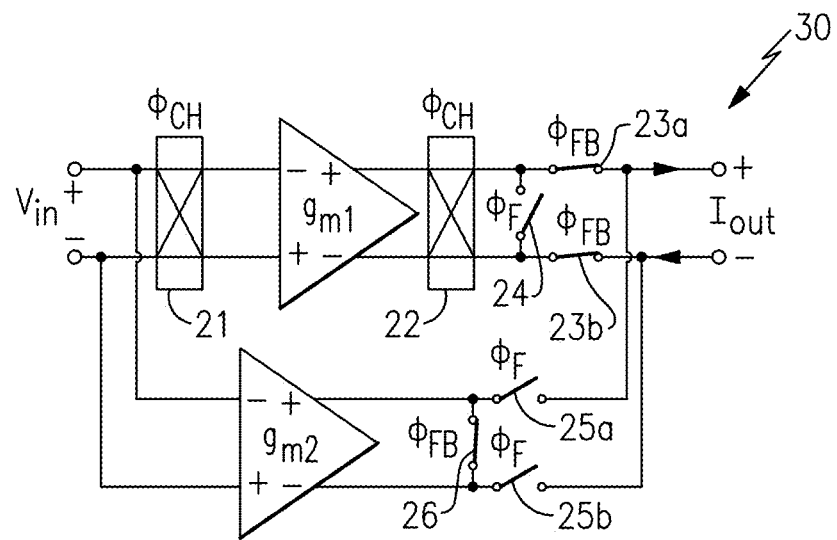
FIG. 2A is a schematic diagram of another embodiment of a chopper amplifier with IMD compensation.
Figure 2B:
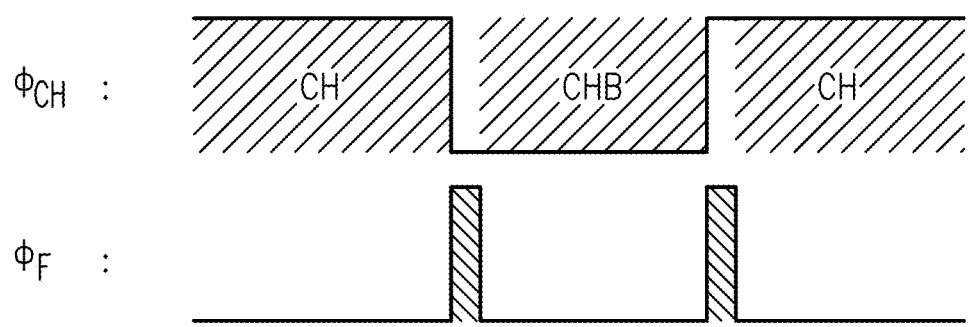
FIG. 2B is one example of a timing diagram for the chopper amplifier of FIG. 2A.

FIG. 2A is a schematic diagram of another embodiment of a chopper amplifier 30 with IMD compensation. FIG. 2B is one example of a timing diagram for the chopper amplifier 30 of FIG. 2A.

In the illustrated embodiment, the chopper amplifier 30 includes input chopping switches 21 controlled by a chopping clock signal $\varphi_{CH}$, a first transconductance stage $g_{m1}$, output chopping switches 22 controlled by the chopping clock signal $\varphi_{CH}$, a first pair of channel output switches 23a-23b controlled by an inverted fill-in clock signal $\varphi_{FB}$, a first channel shorting switch 24 controlled by a fill-in clock signal $\varphi_F$, a second transconductance stage $g_{m2}$, a second pair of channel output switches 25a-25b controlled by the fill-in clock signal $\varphi_F$, and a second channel shorting switch 26 controlled by the inverted fill-in clock signal $\varphi_{FB}$.

As shown in FIG. 2A, a differential input of the input chopping switches 21 and a differential input of the second transconductance stage $g_{m2}$ receive a differential input signal $V_{in}$. Additionally, the first pair of output selection switches 23a-23b and the second pair of output selection switches 25a-25b select between the main signal channel and the distortion compensation channel to control the differential output current $I_{OUT}$ provided at the differential output.

An example timing diagram for the chopper amplifier 30 is shown in FIG. 2B. When the chopping clock signal (CH is in a first state (logically high, in this example) the main signal channel (through the first transconductance stage $g_{m1}$) operates in a chopping mode (CH), while when the chopping clock signal $\varphi_{CH}$ is in a second state (logically low, in this example) the main signal channel operates in an inverted chopping mode (CHB).

With reference to FIGS. 2A and 2B, IMD compensation is provided using the second transconductance stage $g_{m2}$, which can be a replica of the first transconductance stage $g_{m1}$ of the main signal path. The second transconductance stage $g_{m2}$ serves as a distortion compensation channel.

In the illustrated embodiment, continuous output current is provided by using the second transconductance stage $g_{m2}$ for filling in on chopping transitions and removing the discontinuous current moments. The second transconductance stage $g_{m2}$ is inactive for most of the time, but serves to fill in for output current when transitioning the chopping clock signal $\varphi_{CH}$ from one state to another (to switch between CH and CHB modes). The highlights in FIG. 2B (indicated by dashed fill) signifies which channel is connected in the chopper amplifier's signal path, from $V_{in}$ to $I_{out}$, at that particular moment. As used herein, dotted or dashed highlights are used to signify which channel is connected in the chopper amplifier's signal path at a given moment.

Figure 2C:
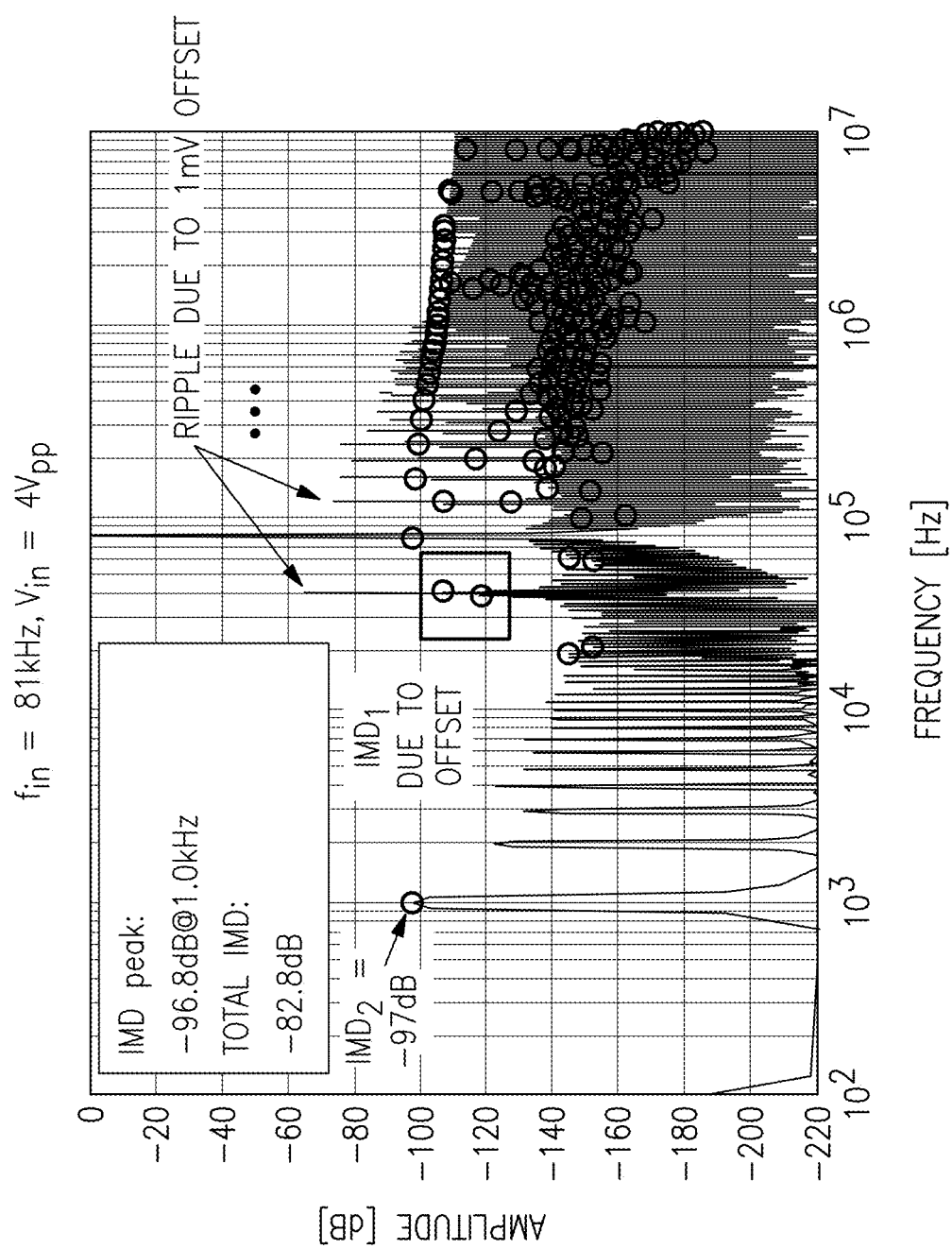
FIG. 2C is a graph of amplitude versus frequency for one implementation of a chopper amplifier without IMD compensation.
Figure 2D:
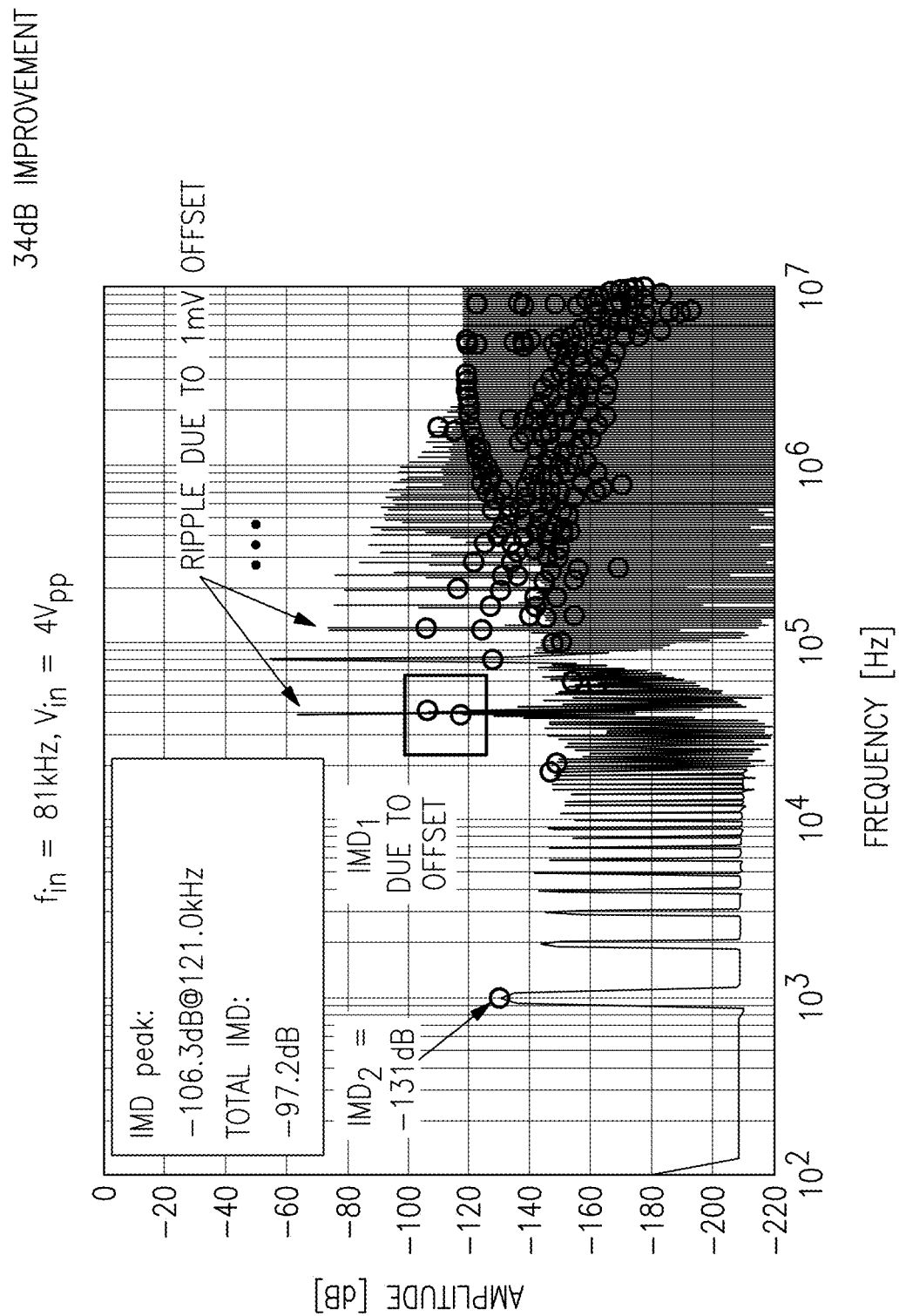
FIG. 2D is a graph of amplitude versus frequency for one implementation of the chopper amplifier of FIG. 2A.

FIG. 2C is a graph of amplitude versus frequency for one implementation of a chopper amplifier without IMD compensation. FIG. 2D is a graph of amplitude versus frequency for one implementation of the chopper amplifier 30 of FIG. 2A.

As shown by a comparison of FIG. 2C (without IMD compensation) and FIG. 2D (with IMD compensation), a 34 dB reduction in IMD is provided using the configuration with the fill in technique, in this example.

Figure 3A:
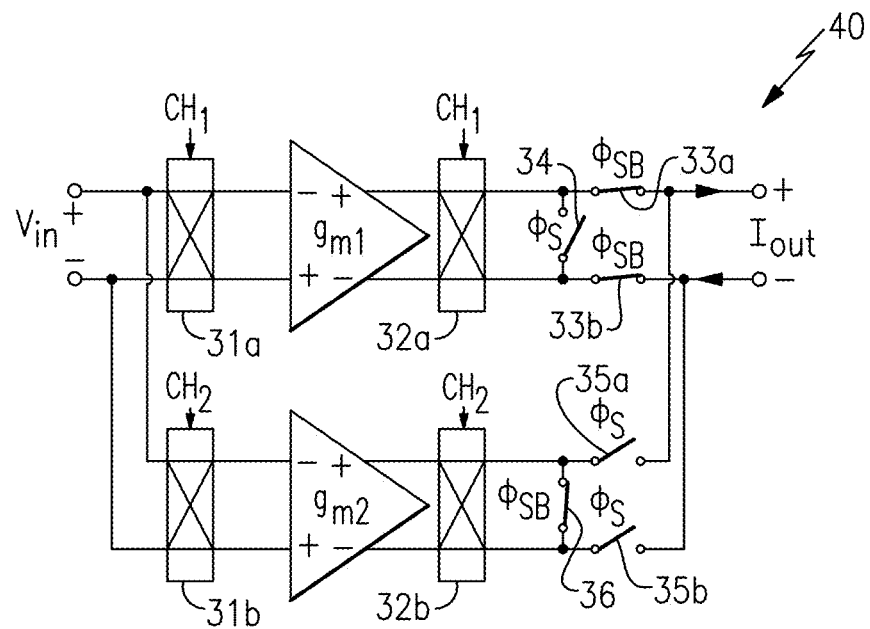
FIG. 3A is a schematic diagram of another embodiment of a chopper amplifier with IMD compensation.
Figure 3B:
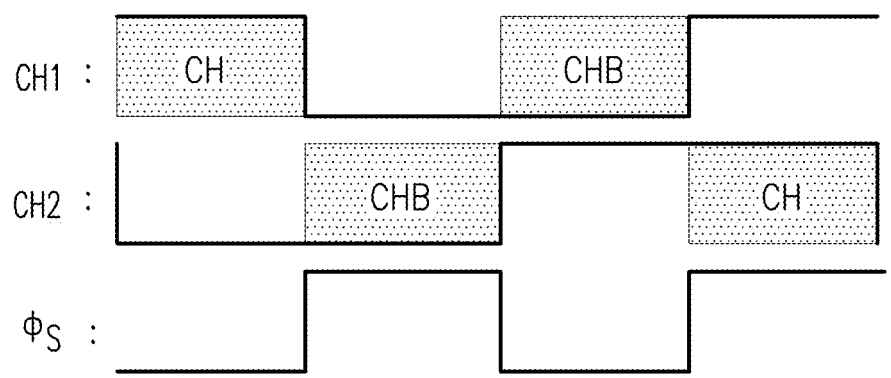
FIG. 3B is one example of a timing diagram for the chopper amplifier of FIG. 3A.

FIG. 3A is a schematic diagram of another embodiment of a chopper amplifier 40 with IMD compensation. FIG. 3B is one example of a timing diagram for the chopper amplifier 40 of FIG. 3A.

In the illustrated embodiment, the chopper amplifier 40 includes first input chopping switches 31a controlled by a first chopping clock signal $CH_1$, a first transconductance stage $g_{m1}$, first output chopping switches 32a controlled by the first chopping clock signal $CH_1$, a first pair of channel output switches 33a-33b controlled by an inverted settling clock signal $\varphi_{SB}$, a first channel shorting switch 34 controlled by a settling clock signal $\varphi_S$, second input chopping switches 31b controlled by a second chopping clock signal $CH_2$, a second transconductance stage $g_{m2}$, second output chopping switches 32b controlled by the second chopping clock signal $CH_2$, a second pair of channel output switches 35a-35b controlled by the settling clock signal $\varphi_S$, and a second channel shorting switch 36 controlled by the inverted settling clock signal $\varphi_{SB}$.

As shown in FIG. 3A, a differential input of the first input chopping switches 31a and a differential input of the second chopping switches 31b receive a differential input signal $V_{in}$. Additionally, the first pair of output selection switches 33a-33b and the second pair of output selection switches 35a-35b control the differential output current $I_{OUT}$ provided at the differential output.

An example timing diagram for the chopper amplifier 40 is shown in FIG. 3B. The main signal channel (associated with stage $g_{m1}$) operates in either a chopping mode (CH) or an inverted chopping mode (CHB) based on a state of the first chopping clock signal $CH_1$ and whether or not the settling clock signal $\varphi_S$ is high to short the output of the main signal channel. Additionally, the compensation signal channel (associated with stage $g_{m2}$) operates in either the chopping mode (CH) or the inverted chopping mode (CHB) based on a state of the second chopping clock signal $CH_2$ and whether or not the settling clock signal $\varphi_S$ is low to short the output of the compensation signal channel.

In the illustrated embodiment, a settling technique is provided in which continuous current is provided by making sure a channel is settled before it is connected to the output terminal. In this example, the main signal channel and the IMD compensation channel can be identical, but operate with staggered timing.

Figure 4A:
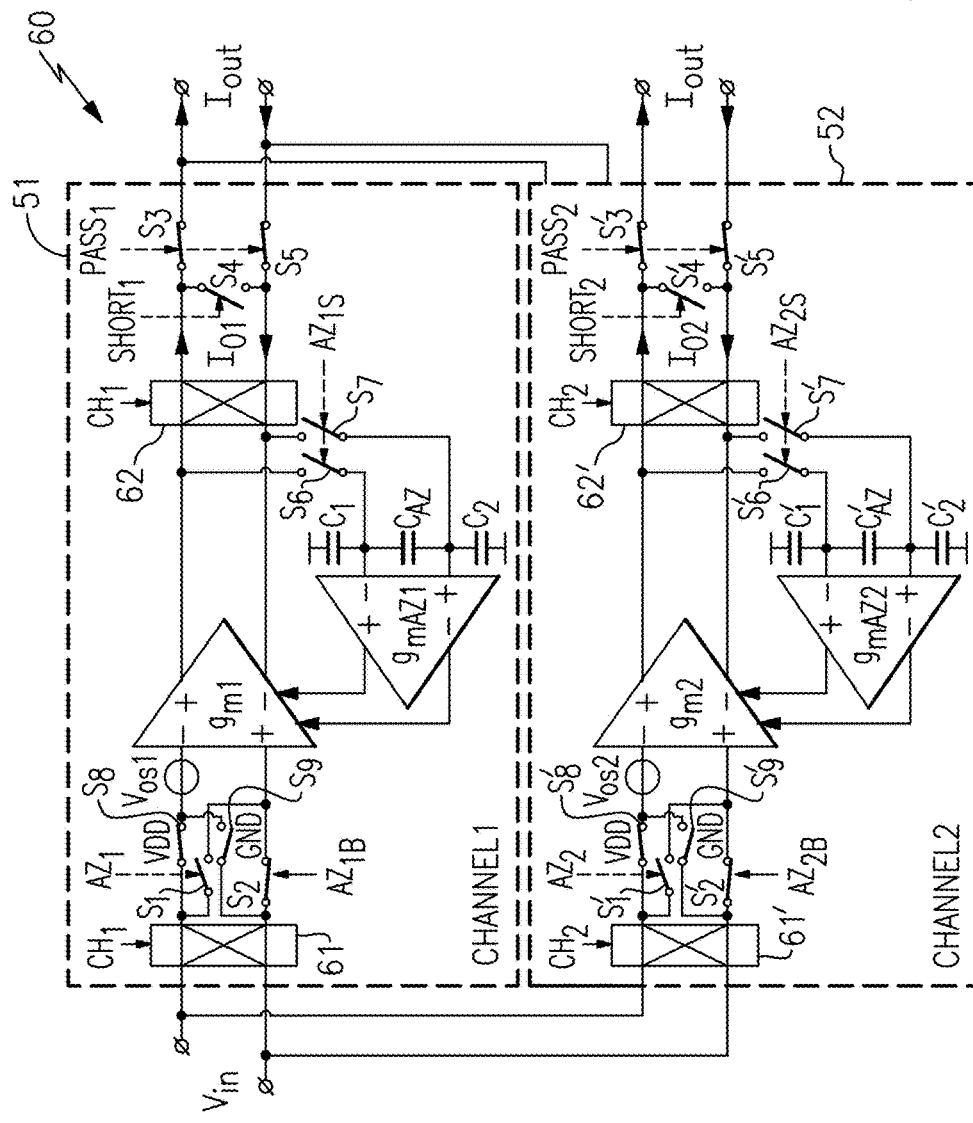
FIG. 4A is a schematic diagram of another embodiment of a chopper amplifier with IMD compensation and auto-zeroing.
Figure 4B:
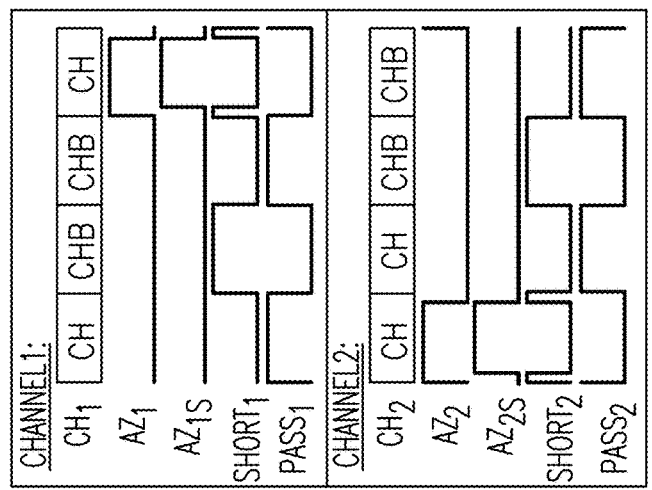
FIG. 4B is one example of a timing diagram for the chopper amplifier of FIG. 4A.

FIG. 4A is a schematic diagram of another embodiment of a chopper amplifier 60 with IMD compensation and auto-zeroing. FIG. 4B is one example of a timing diagram for the chopper amplifier 60 of FIG. 4A.

In the illustrated embodiment, the chopper amplifier 60 includes a first channel or main signal channel 51 and a second channel or distortion compensation channel 52 operating with delayed clock and control signals relative to the first channel 51.

As shown in FIG. 4A, the first channel 51 includes input chopping switches 61 controlled by a first clock signal $CH_1$, a first OTA $g_{m1}$, output chopping switches 62 controlled by the first clock signal $CH_1$, a first auto-zero amplifier $g_{mAZ1}$, a first switch $S_1$ controlled by a first auto-zero signal $AZ_1$, a second switch $S_2$ controlled by a first inverted auto-zero signal $AZ_{1B}$, a third switch $S_3$ controlled by a first pass signal $PASS_1$, a fourth switch $S_4$ controlled by a first short signal $SHORT_1$, a fifth switch $S_5$ controlled by the first pass signal $PASS_1$, a sixth switch $S_6$ controlled by a first auto-zero sampling signal $AZ_{1S}$, a seventh switch $S_7$ controlled by the first auto-zero sampling signal $AZ_{1S}$, an eighth switch $S_8$ controlled by VDD, a ninth switch $S_9$ controlled by GND, a first capacitor $C_1$, a second capacitor $C_2$, and an auto-zero sampling capacitor $C_{AZ}$.

The second channel 52 includes a replica of the components of the first channel 51, but is controlled by different control signals. For example, the second channel 52 includes input chopping switches 61' controlled by a second clock signal $CH_2$, a second OTA $g_{m2}$, output chopping switches 62' controlled by the second clock signal $CH_2$, a second auto-zero amplifier $g_{mAZ2}$, a first switch $S_1'$ controlled by a second auto-zero signal $AZ_2$, a second switch $S_2'$ controlled by a second inverted auto-zero signal $AZ_{2B}$, a third switch $S_3'$ controlled by a second pass signal $PASS_2$, a fourth switch $S_4'$ controlled by a second short signal $SHORT_2$, a fifth switch $S_5'$ controlled by the second pass signal $PASS_2$, a sixth switch $S_6'$ controlled by a second auto-zero sampling signal $AZ_{2S}$, a seventh switch $S_7'$ controlled by the second auto-zero sampling signal $AZ_{2S}$, an eighth switch $S_8'$ controlled by VDD, a ninth switch $S_9'$ controlled by GND, a first capacitor $C_1'$, a second capacitor $C_2'$, and an auto-zero sampling capacitor $C_{AZ}'$.

With reference to FIGS. 4A and 4B, the chopper amplifier 60 employs two nominally identical OTAs ($g_{m1}$ and $g_{m2}$), which are chopped by quadrature clocks ($CH_1$ and $CH_2$) such that chopping transitions are only experienced by one OTA at a time. Due to the finite delay of the OTAs, the output currents ($I_{o1}$ and $I_{o2}$) contain chopping spikes.

However, since the chopping spikes do not occur at the same time, multiplexer switches ($S_3/S_3'$ and $S_5/S_5'$) that switch well before the chopping transition ($PASS_1$ and $PASS_2$) can be used to ensure that $I_{out}$ is kept constant. In particular, the multiplexer switches ($S_3/S_3'$ and $S_5/S_5'$) can switch the OTA's output currents much faster than the OTAs themselves.

To reduce the ripple caused by the OTA's chopped offset ($V_{os1}$ and $V_{os2}$), $g_{m1}$ and $g_{m2}$ are auto-zeroed whenever they are not driving the output terminals, which can be connected, for instance, to an integrating amplifier stage with transconductance $g_{mINT}$. During the auto-zero (AZ) phase, the OTA inputs are shorted to one of the input pins through $S_1/S_1'$, instead of being shorted to a fixed common-mode (CM) voltage. This prevents input CM transients, which would cause extra IMD.

To ensure that the finite on-resistance of $S_1/S_1'$ does not create a differential AC input voltage due to a difference in the delay towards the two OTAs inputs, a dummy always-closed switch $S_8/S_8'$ is included for each channel. A second dummy always-open switch $S_9/S_9'$ in each channel makes sure that the parasitic capacitance and the associated feedthrough is symmetric to both OTA inputs. During the AZ phase, $C_{AZ}$ (for instance, 25 pF) acts as a passive integrator and drives $g_{mAZ1}$ to cancel the OTA's offset.

The resulting voltage is then held by $C_1$ and $C_2$ (for instance, 1.8 pF each) during the amplification phase. To minimize noise folding, a low loop BW during the AZ phase is desired by limiting $g_{mAZ1}$, but this undesirably increases the OTA's worst-case output swing. As a compromise, in one example $g_{mAZ1}$ is chosen to be about 50× smaller than $g_{m1}$. Furthermore, the AZ phase is ended before the next chop phase, allowing $g_{m1}$ and $g_{m2}$ to settle before it is connected to downstream circuitry, for instance, $G_{mINT}$.

When the OTA outputs are not connected to either downstream circuitry (for instance, $g_{mINT}$) or to $g_{mAZ1}$, shorting switch ($S_4/S_4'$) maintains them at a well-defined voltage. For applications using a downstream integrator $g_{mINT}$, the resistance of the switch can be chosen to be about $\sim 1/g_{mINT}$ (for instance, 6.8 kOhm), which minimizes the voltage transient that occurs when the OTA is re-connected to $g_{mINT}$ and thus mitigates the associated switching spikes. At the start of the AZ phase, the OTA's output switches from a signal-dependent current to an offset-dependent current, and thus for fast settling and mitigation of additional output spikes its output can be shorted. To avoid disturbing the state of $C_{AZ}$, it is disconnected by switches $S_6/S_6'$ and $S_7/S_7'$ while the OTA is shorted (SHORT$_1$ and SHORT$_2$).

Figure 5A:
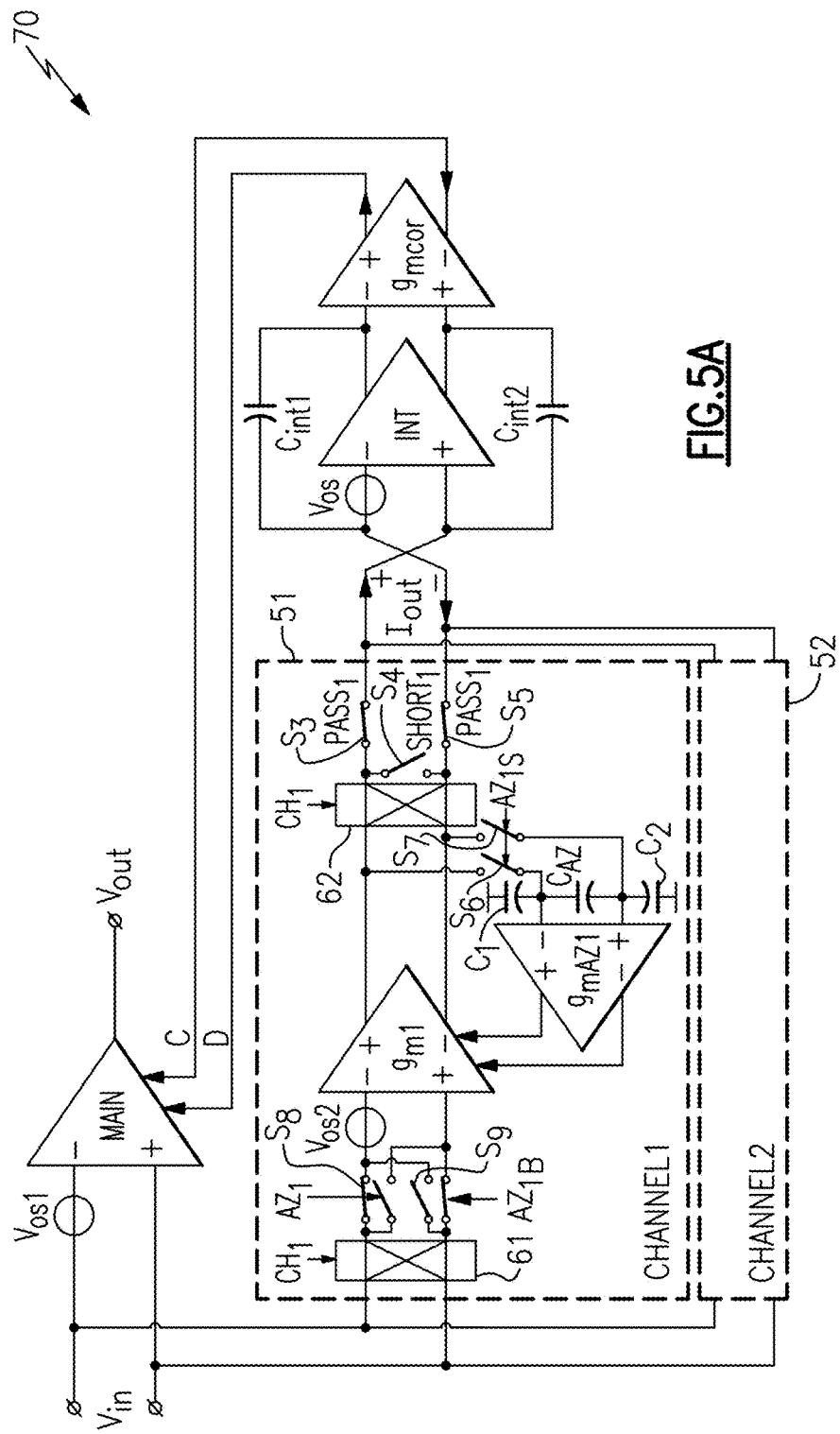
FIG. 5A is a schematic diagram of another embodiment of a chopper amplifier with IMD compensation and auto-zeroing.
Figure 5B:
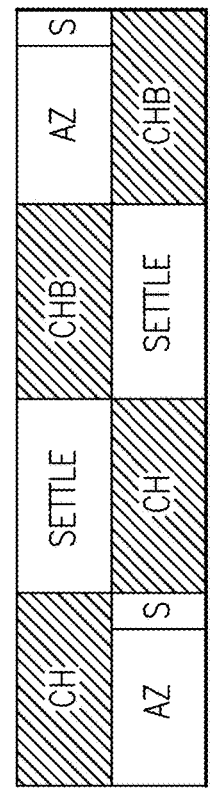
FIG. 5B is one example of a timing diagram for the chopper amplifier of FIG. 5A.

FIG. 5A is a schematic diagram of another embodiment of a chopper amplifier 70 with IMD compensation and auto-zeroing. FIG. 5B is one example of a timing diagram for the chopper amplifier 70 of FIG. 5A. For clarity of FIG. 5A, only the components of the first channel 51 are explicitly shown, while the second channel 52 is depicted without explicitly showing the replicated components of the first channel 51. Such components of the second channel 52 were previously shown in FIG. 4A.

The chopper amplifier 70 of FIG. 5A is similar to the chopper amplifier 60 of FIG. 4A, except that the chopper amplifier 70 includes additional components for processing the differential output current $I_{out}$. In particular, the chopper amplifier 70 is implemented as a chopper-stabilized amplifier. Although one example of components is shown, the teachings herein are applicable to a wide range of circuitry and chopper amplifier topologies. Accordingly, other implementations are possible.

In the illustrated embodiment, the chopper amplifier 70 includes a first channel 51, a second channel 52, an integration stage (INT), integration capacitors ($C_{int1}$ and $C_{int2}$), a correction stage ($g_{mcor}$), and a main amplifier (MAIN) (with current steering controlled by signals C and D from $g_{mcor}$ to provide input offset correction). This circuitry illustrates one of many examples of circuitry a chopper amplifier can include. However, the IMD compensation schemes herein are applicable to any type of chopper amplifier.

By using chopping circuitry to provide input offset correction to a main amplifier, chopper stabilization is provided. Chopper amplifiers implemented in this configuration are also referred to herein as chopper-stabilized amplifiers.

With reference to FIG. 5B, chopping, auto-zeroing, settling, and an output shorting (S) technique are used for each channel. By using chopping and auto-zeroing, offset is reduced, and thus chopping ripple. Accordingly, the chopper amplifier operates with low noise and ripple.

As shown in FIG. 5B, no direct chopping to inverted chopping periods are provided to reduce complexity of timing. Rather a settling period is included between the chopping and inverted chopping periods. Furthermore, an auto-zeroing phase is provided after the inverted chopping phase, and an output shorting phase is provided after the auto-zeroing phase and before the chopping phase.

Figure 6A:
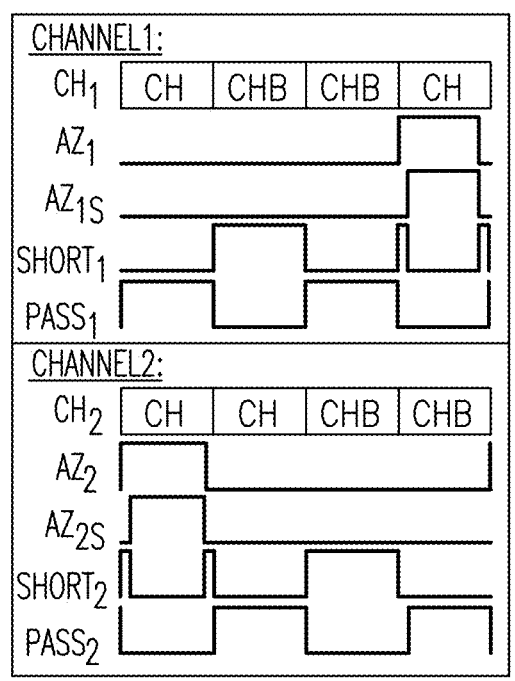
FIG. 6A is another example of a timing diagram for the chopper amplifier of FIG. 5A.

FIG. 6A is another example of a timing diagram for the chopper amplifier 70 of FIG. 5A. The timing diagram of FIG. 6A corresponds to a more detailed implementation of the timing diagram of FIG. 5B.

In the illustrated embodiment, quick auto-zeroing settling is provided. By quickly settling the current coming out of $g_{m1}$ during auto-zeroing, the output of $g_{m1}$ is shorted (to avoid the settling giving rise to IMD tones).

Figure 6B:
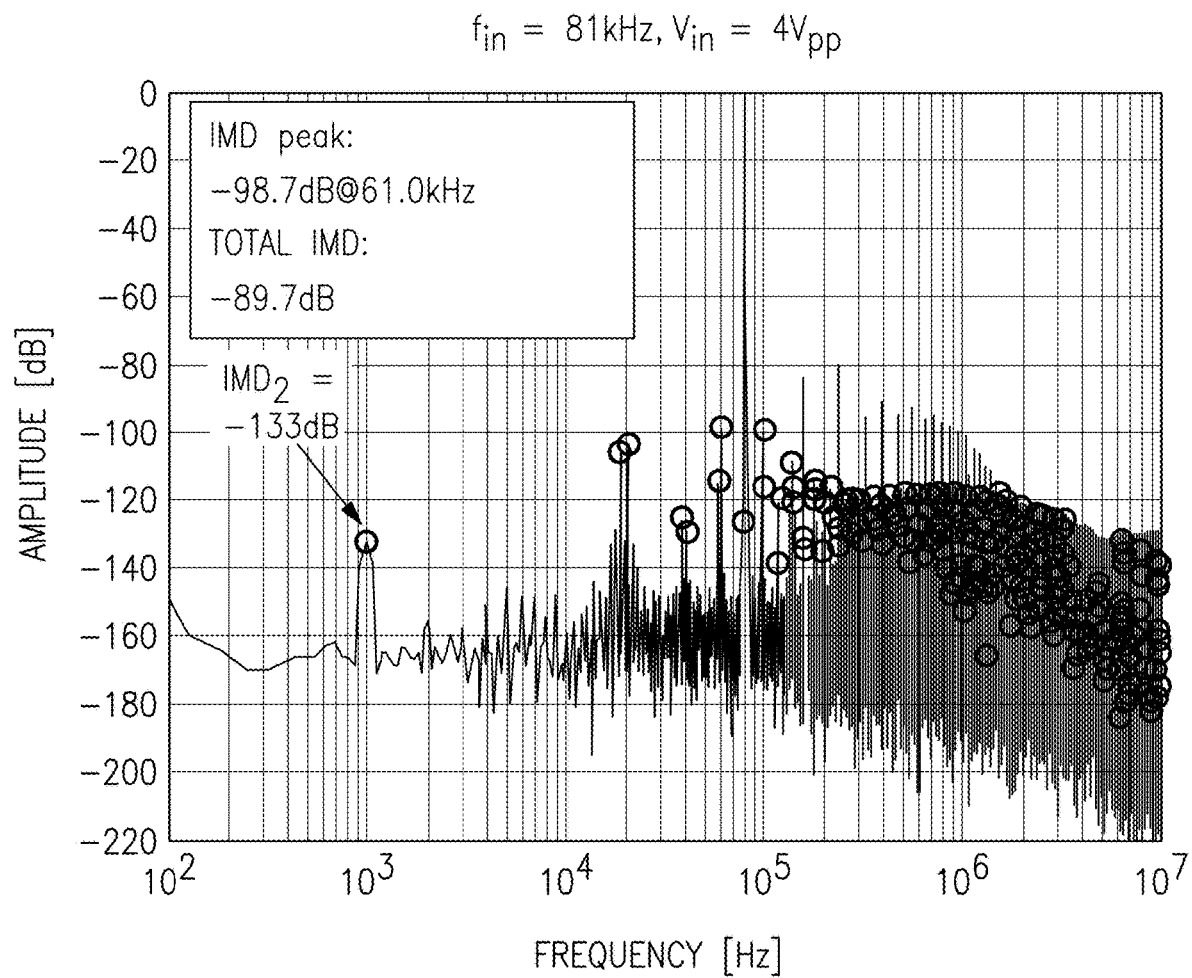
FIG. 6B is a graph of amplitude versus frequency for one implementation of the chopper amplifier of FIG. 5A.

FIG. 6B is a graph of amplitude versus frequency for one implementation of the chopper amplifier 70 of FIG. 5A.

As shown by a comparison to FIG. 2C, IMD performance is improved and the ripple is suppressed.

Figure 7:
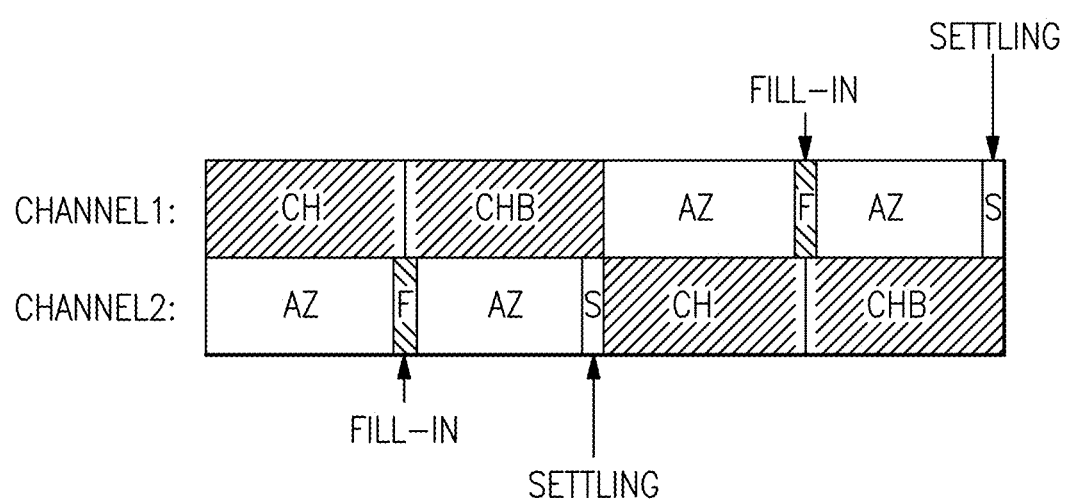
FIG. 7 is another example of a timing diagram for the chopper amplifier of FIG. 5A.

FIG. 7 is another example of a timing diagram for the chopper amplifier 70 of FIG. 5A.

As shown in FIG. 7, when transitioning the chopping clock signal, a fill-in technique is used by the other channel, thereby reducing IMD. Furthermore when switching one channel from auto-zeroing to being connected in the signal path, a settling phase is used.

Figure 8:
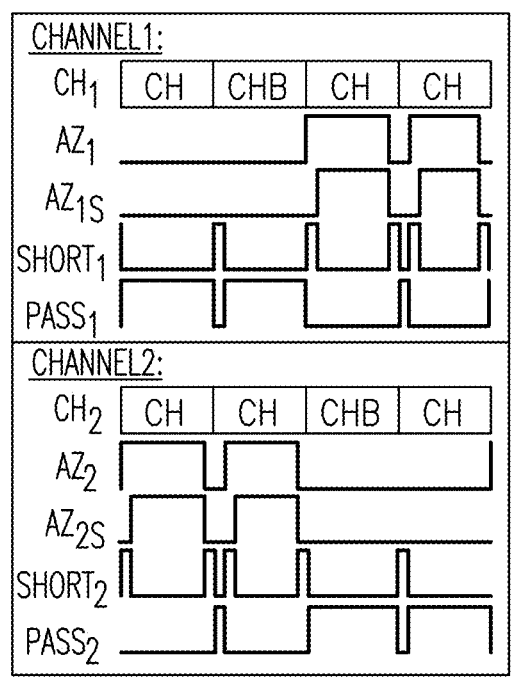
FIG. 8 is another example of a timing diagram for the chopper amplifier of FIG. 5A.

FIG. 8 is another example of a timing diagram for the chopper amplifier 70 of FIG. 5A. The timing diagram of FIG. 8 corresponds to a more detailed implementation of the timing diagram of FIG. 7.

In the illustrated embodiment, quick auto-zeroing settling is provided. By quickly settling the current coming out of $g_{m1}$ during auto-zeroing, the output of $g_{m1}$ is shorted (to avoid the settling giving rise to IMD tones).

FIG. 9A is a schematic diagram of one example of differential virtual ground swing of an integrator at the output of a chopper amplifier 100. FIG. 9B is a schematic diagram of another example of differential virtual ground swing of an integrator at the output of a chopper amplifier 100.

In the illustrated embodiment, the chopper amplifier 100 includes input chopping switches 91 controlled by a chopping clock signal $\varphi_{CH}$, an amplifier A1, output switches 92 controlled by the chopping clock signal $\varphi_{CH}$, a pair of pass switches 93a-93b, a shorting switch 94, an integrator stage INT, a first integration capacitor $C_{int1}$, and a second integration capacitor $C_{int2}$. The amplifier A1 has a differential output voltage $V_{AB}$.

In FIG. 9A the chopper amplifier 100 is shown with the shorting switch 94 open and with the pair of pass switches 93a-93b closed. Additionally, in FIG. 9B the chopper amplifier 100 is shown with the shorting switch 94 closed and with the pair of pass switches 93a-93b open.

To avoid jumps in $V_{AB}$ in between short and pass to avoid signal-dependent parasitic charge, a resistance Rs of the shorting switch 94 when closed can be selected to be about equal to $1/g_{m1}$, where $g_{m1}$ is the transconductance of the integrator stage INT.

Figures 10A, 10B:
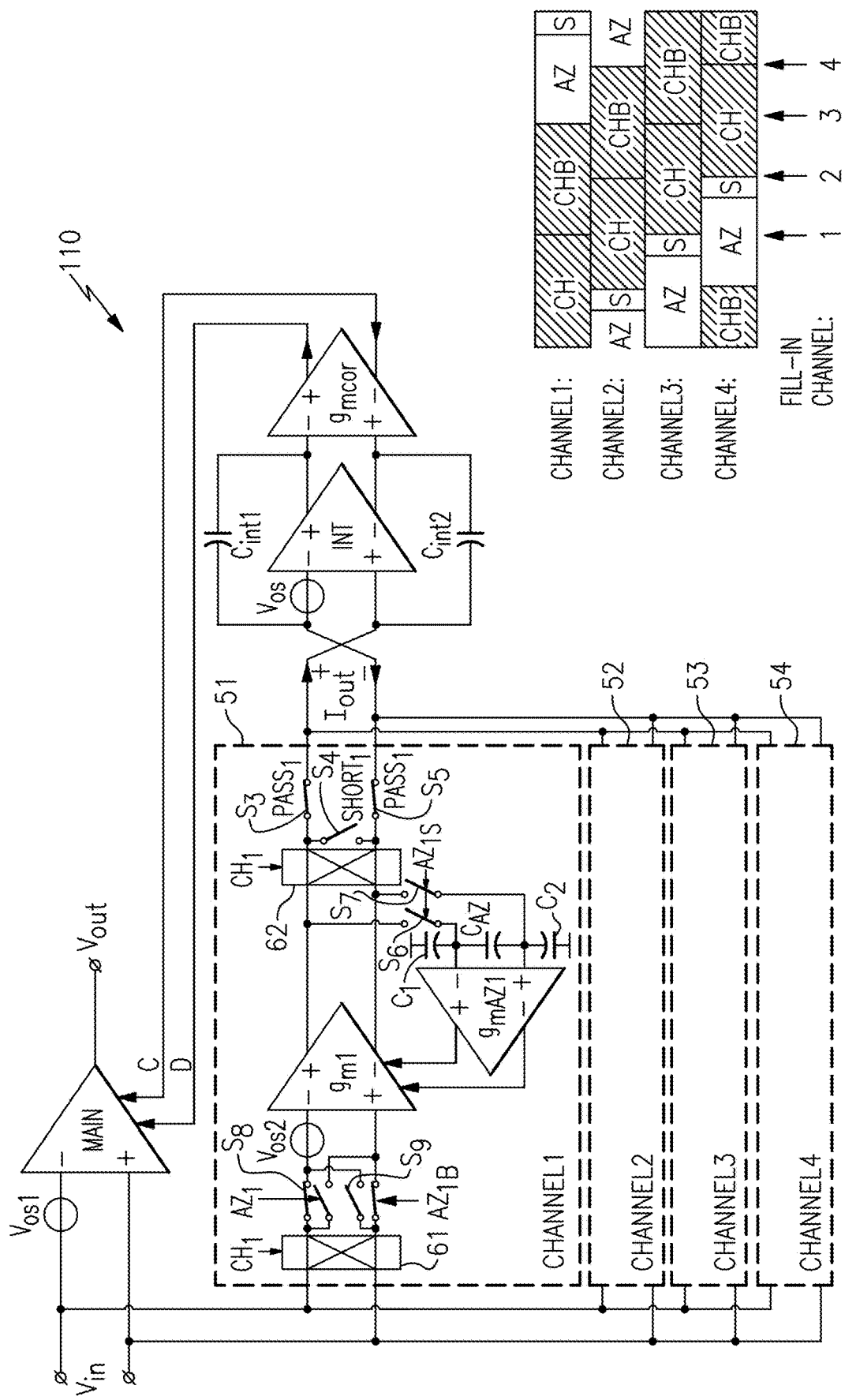
FIG. 10A is a schematic diagram of another embodiment of a chopper amplifier with IMD compensation and auto-zeroing.
FIG. 10B is one example of a timing diagram for the chopper amplifier of FIG. 10A.

FIG. 10A is a schematic diagram of another embodiment of a chopper amplifier 110 with IMD compensation and auto-zeroing. The chopper amplifier 110 of FIG. 10A is similar to the chopper amplifier 60 of FIG. 5A, except that the chopper amplifier 110 of FIG. 10A further includes a third channel 53 and a fourth channel 54.

For clarity of FIG. 10A, only the components of the first channel 51 are explicitly shown, while the components of the second channel 52, the third channel 53, and the fourth channel 54 are not shown. However, the second channel 52, the third channel 53, and the fourth channel 54 each include a replicated set of components of the first channel 51. The second channel 52, the third channel 53, and the fourth channel 54 each operate with a different set of control signals relative to the first channel 51.

FIG. 10B is one example of a timing diagram for the chopper amplifier 110 of FIG. 10A.

In this embodiment, four channels are used to provide settling (for low IMD) with interleaving to reduce transconductance per stage for a given amount of output current drive. For example, more stages are turned on at a given time in this configuration, thereby reducing transconductance per stage relative to a two channel configuration. In certain embodiments, each channel can be selectively enabled or disabled to control power consumption. For example, any unused distortion compensation channel(s) can be turned off to reduce power dissipation.

Figure 11A:
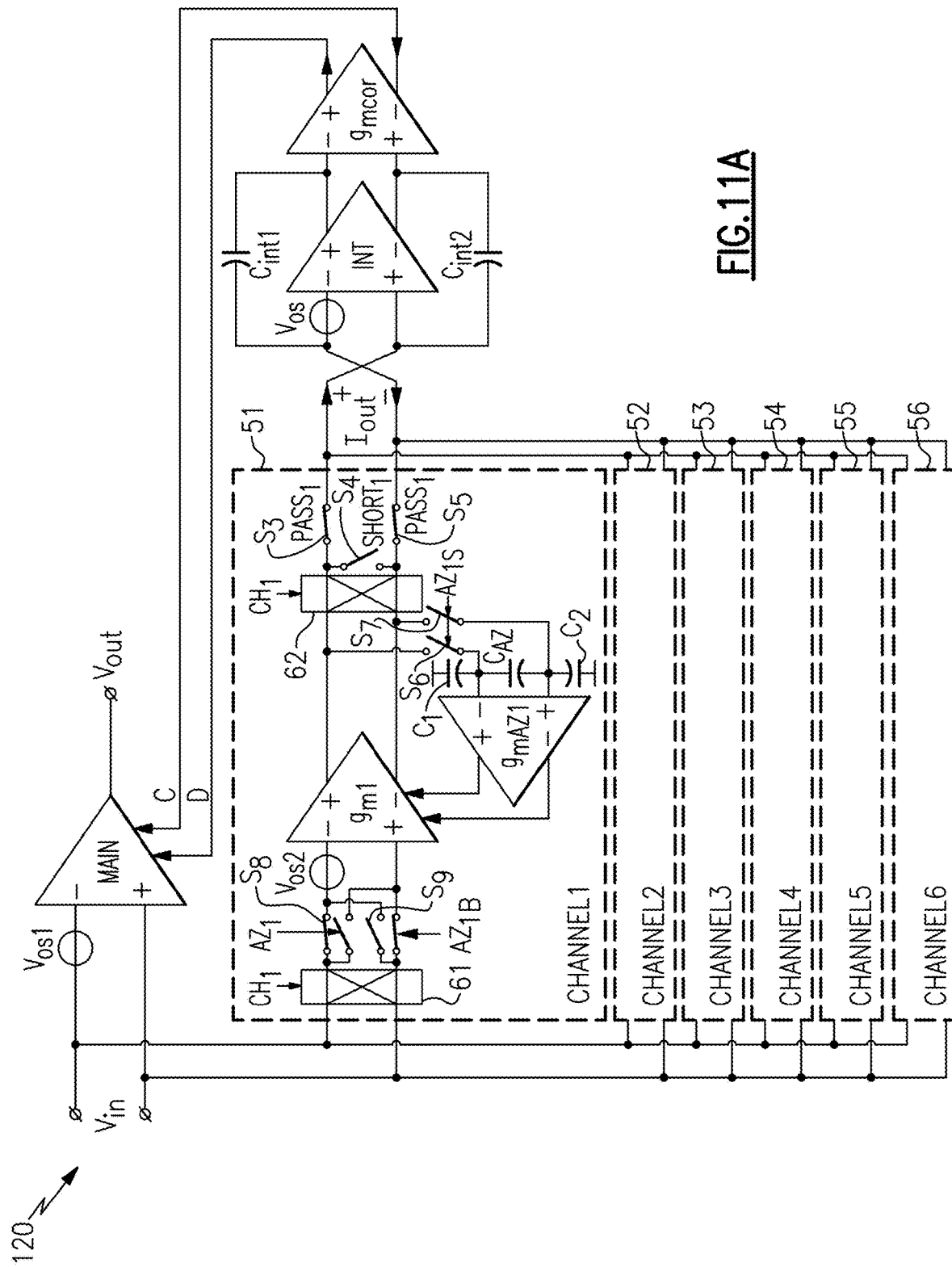
FIG. 11A is a schematic diagram of another embodiment of a chopper amplifier with IMD compensation and auto-zeroing.

FIG. 11A is a schematic diagram of another embodiment of a chopper amplifier 120 with IMD compensation and auto-zeroing. The chopper amplifier 120 of FIG. 11A is similar to the chopper amplifier 60 of FIG. 5A, except that the chopper amplifier 120 of FIG. 11A further includes a fifth channel 55 and a sixth channel 56.

For clarity of FIG. 11A, only the components of the first channel 51 are explicitly shown, while the components of the second channel 52, the third channel 53, the fourth channel 54, the fifth channel 55, and the sixth channel 56 are not shown. However, the second channel 52, the third channel 53, the fourth channel 54, the fifth channel 55, and the sixth channel 56 each include a replicated set of components of the first channel 51, but operate with different timing.

Figure 11B:
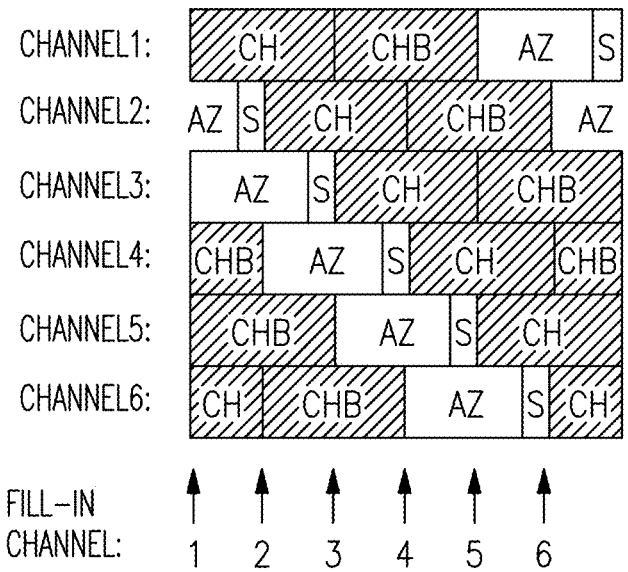
FIG. 11B is one example of a timing diagram for the chopper amplifier of FIG. 11A.

FIG. 11B is one example of a timing diagram for the chopper amplifier of FIG. 11A.

In this embodiment, six channels are used. However, any number of channels can be used for interleaving.

Figure 11C:
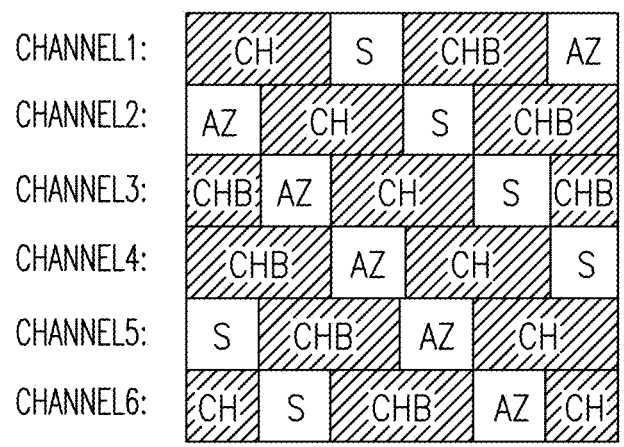
FIG. 11C is another example of a timing diagram for the chopper amplifier of FIG. 11A.

FIG. 11C is another example of a timing diagram for the chopper amplifier of FIG. 11A.

The timing diagram of FIG. 11C illustrates another possible timing configuration using six channels for interleaving.

Figure 12:
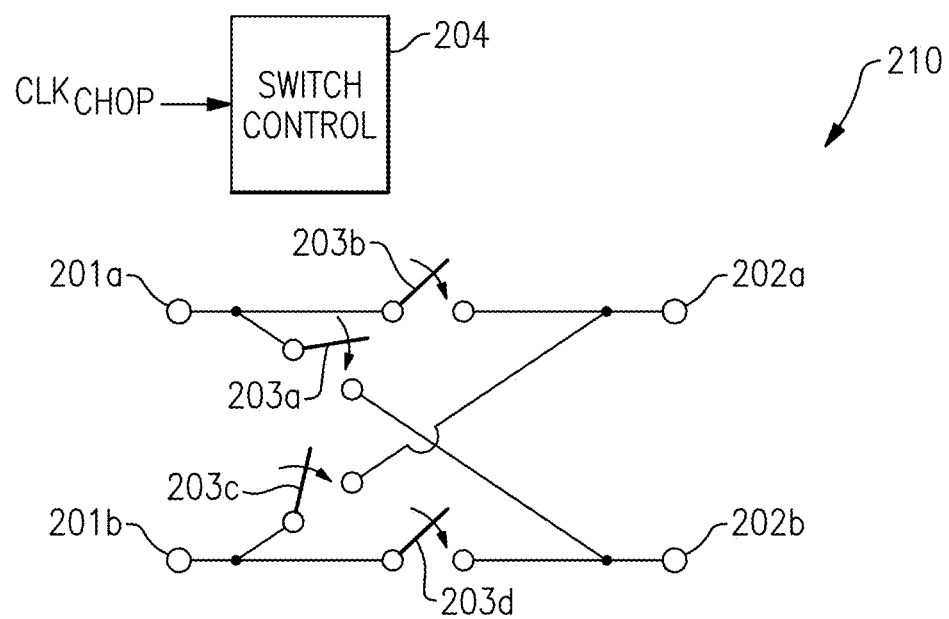
FIG. 12 is a schematic diagram of one example of a chopping circuit that can be used in a chopper amplifier.

FIG. 12 is a schematic diagram of one example of a chopping circuit 210 that can be used in a chopper amplifier. The chopping circuit 210 illustrates one implementation of a chopping circuit that can be used in the chopper amplifiers herein as an input chopping circuit or an output chopping circuit. However, chopping circuits can be implemented in other ways.

As shown in FIG. 12, the chopping circuit 210 includes first and second inputs 201a, 201b that operate as a differential input, first and second outputs 202a, 202b that operate as a differential output, first to fourth switches 203a-203d, and a switch control circuit 204. As shown in FIG. 12, the switch control circuit 204 receives a chopping clock signal $CLK_{CHOP}$, which can be used to control a state of the switches 203a-203d over time. Although illustrated as including the switch control circuit 204, in certain configurations the switch control circuit 204 is omitted in favor of providing multiple clock signals (for example, inverted and non-inverted versions of a chopping clock signal, with or without non-overlap) to the chopping circuit 210.

The first input 201a is electrically connected to a first end of the first switch 203a and to a first end of the second switch 203b. The second input 201b is electrically connected to a first end of the third switch 203c and to a first end of the fourth switch 203d. The first output 202a is electrically connected to a second end of the second switch 203b and to a second end of the third switch 203c. The second output 202b is electrically connected to a second end of the first switch 203a and to a second end of the fourth switch 203d.

The chopping circuit 210 can be used to chop a differential input signal received between the first and second inputs 201a, 201b to generate a differential chopped signal between the first and second outputs 202a, 202b. For example, during a first clock phase of the chopping clock signal $CLK_{CHOP}$, the switch control circuit 204 can close the second and fourth switches 203b, 203d and open the first and third switches 203a, 203c. Additionally, during a second clock phase of the chopping clock signal $CLK_{CHOP}$, the switch control circuit 204 can close the first and third switches 203a, 203c and open the second and fourth switches 203b, 203d.

The clock signals disclosed herein can be implemented in a wide variety of ways, including, for example, by using any suitable clock generator. In certain implementations, a common clock signal is used to synthesize clock signals used for chopping, auto-zeroing, digital processing, and/or other operations of a chopper amplifier.

Applications

Devices employing the above described schemes can be implemented into various electronic devices. Examples of electronic devices include, but are not limited to, consumer electronic products, electronic test equipment, communication systems, data converters, etc.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A chopper amplifier with compensation for intermodulation distortion, the chopper amplifier comprising:
   a main signal channel comprising:
      input chopping switches configured to chop an input signal to generate a chopped input signal;
      a first amplifier configured to amplify the chopped input signal to generate an amplified signal; and
      output chopping switches configured to chop the amplified signal to generate a chopped output signal;
   a distortion compensation channel configured to receive the input signal, and to provide compensation for intermodulation distortion arising from a delay of the first amplifier, wherein the distortion compensation channel does not include any chopping switches;
   a differential input terminal configured to provide the input signal to the input chopping switches of the main signal channel, wherein the distortion compensation channel includes a second amplifier having a differential input connected to the differential input terminal without any intervening chopping switches;

a plurality of output selection switches configured to select the chopped output signal during a first phase and to select an output signal of the distortion compensation channel in a second phase.

2. The chopper amplifier of claim 1, wherein the output chopping switches are controlled by a chopping clock signal, the second phase occurring in response to a transition of the chopping clock signal.

3. The chopper amplifier of claim 2, wherein the second phase is shorter than the first phase.

4. The chopper amplifier of claim 2, wherein the second amplifier is a replica of the first amplifier.

5. The chopper amplifier of claim 1, wherein the chopped output signal settles during the second phase, and the output signal of the distortion compensation channel settles during the first phase.

6. The chopper amplifier of claim 1, further comprising an integration stage having an input coupled to the output selection switches.

7. A chopper amplifier with compensation for intermodulation distortion, the chopper amplifier comprising:
a main signal channel comprising:
input chopping switches configured to chop an input signal to generate a chopped input signal;
an amplifier configured to amplify the chopped input signal to generate an amplified signal; and
output chopping switches configured to chop the amplified signal to generate a chopped output signal; and
a distortion compensation channel configured to receive the input signal, and to provide compensation for intermodulation distortion arising from a delay of the amplifier;
a plurality of output selection switches configured to select the chopped output signal during a first phase and to select an output signal of the distortion compensation channel in a second phase;
an integration stage having an input coupled to the output selection switches; and
a main amplifier, wherein an output of the integration stage controls an input offset of the main amplifier.

8. The chopper amplifier of claim 7, wherein the amplifier is an operational transconductance amplifier (OTA).

9. The chopper amplifier of claim 1, wherein the main signal channel is auto-zeroed during a portion of the second phase, and the distortion compensation channel is auto-zeroed during a portion of the first phase.

10. The chopper amplifier of claim 8, further comprising a shorting switch configured to short a differential output of the output chopping switches during the second phase, the shorting switch having an on-state resistance about equal to an inverse of a transconductance of the integration stage.

11. A chopper amplifier with compensation for intermodulation distortion, the chopper amplifier comprising:
a main signal channel comprising:
input chopping switches configured to chop an input signal to generate a chopped input signal;
a first amplifier configured to amplify the chopped input signal to generate an amplified signal; and
output chopping switches configured to chop the amplified signal to generate a chopped output signal;
a distortion compensation channel configured to receive the input signal, and to provide compensation for intermodulation distortion arising from a delay of the first amplifier, wherein the distortion compensation channel does not include any chopping switches; and
a plurality of output selection switches configured to select the chopped output signal during a first phase and to select an output signal of the distortion compensation channel in a second phase, wherein the distortion compensation channel includes a second amplifier having a differential output connected to the plurality of output chopping switches without any intervening chopping switches.

12. A chopper amplifier with compensation for intermodulation distortion, the chopper amplifier comprising:
a main signal channel comprising:
input chopping switches configured to chop an input signal to generate a chopped input signal;
a first amplifier configured to amplify the chopped input signal to generate an amplified signal; and
output chopping switches configured to chop the amplified signal to generate a chopped output signal;
a distortion compensation channel configured to receive the input signal, and to provide compensation for intermodulation distortion arising from a delay of the first amplifier, wherein the distortion compensation channel does not include any chopping switches; and
a plurality of output selection switches configured to select the chopped output signal during a first phase and to select an output signal of the distortion compensation channel in a second phase, wherein the first amplifier includes a differential input electrically connected to the input chopping switches and a differential output electrically connected to the output chopping switches, wherein the first amplifier does not include any feedback elements from the differential output to the differential input.

13. The chopper amplifier of claim 11, wherein the output chopping switches are controlled by a chopping clock signal.

14. The chopper amplifier of claim 13, wherein the second phase occurs in response to a transition of the chopping clock signal.

15. The chopper amplifier of claim 11, wherein the second phase is shorter than the first phase.

16. The chopper amplifier of claim 12, wherein the output chopping switches are controlled by a chopping clock signal.

17. The chopper amplifier of claim 16, wherein the second phase occurs in response to a transition of the chopping clock signal.

18. The chopper amplifier of claim 12, wherein the second phase is shorter than the first phase.

* * * * *